(12) United States Patent
Song et al.

(10) Patent No.: US 6,693,446 B2
(45) Date of Patent: Feb. 17, 2004

(54) APPARATUS FOR TESTING RELIABILITY OF INTERCONNECTION IN INTEGRATED CIRCUIT

(75) Inventors: Won-Sang Song, Seoul (KR); Jung-Woo Kim, Kyunggi-do (KR); Chang-Sub Lee, Suwon (KR); Sam-Young Kim, Seoul (KR); Young-Jin Wee, Kyunggi-do (KR); Ki-Chul Park, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/115,184

(22) Filed: Apr. 1, 2002

(65) Prior Publication Data
US 2003/0020497 A1 Jan. 30, 2003

(30) Foreign Application Priority Data

Jul. 24, 2001 (KR) ........................................ 2001-44450

(51) Int. Cl.[7] .............................................. G01R 31/28
(52) U.S. Cl. ...................... 324/719; 324/501; 324/763; 257/84
(58) Field of Search ................................. 324/719, 763, 324/765, 751, 501, 158.1, 722, 537, 133; 361/767, 793; 257/84

(56) References Cited

U.S. PATENT DOCUMENTS 6,268,717 B1 * 7/2001 Jarvis et al. ............. 324/158.1
6,362,634 B1 * 3/2002 Jarvis et al. ................ 324/719

* cited by examiner

Primary Examiner—N. Le
Assistant Examiner—Vincent Q. Nguyen
(74) Attorney, Agent, or Firm—Marger Johnson & McCollom, P.C.

(57) ABSTRACT

In the present invention, an apparatus of testing leakage current protection reliability of an integrated circuit interconnection. The apparatus has at least one comb-like pattern composed of a length portion, multiple tooth portions which are connected orthogonally to the length portion, and vias which are formed vertically from the ends of the tooth portions, respectively, through an interlayer dielectric layer. Additionally the apparatus has a serpentine-like pattern including a length parallel part or a connection part which is running parallel to the length portion, a tooth parallel part which is parallel to the tooth portion and formed at a level different from the level of the connection part or the length parallel part, and vias connecting them. The via of the comb-like pattern is located at the central position between the neighboring two vias of the serpentine-like pattern. The apparatus also has pads for applying a defined bias voltage to the comb-like pattern and the serpentine-like pattern to generate a potential difference between the two patterns. Thus, as multiple weak field regions are formed at the region where the vias are positioned, it is possible to find a failed spot such as a leakage or a short through the apparatus easily and effectively.

15 Claims, 13 Drawing Sheets

APPARATUS FOR TESTING RELIABILITY OF INTERCONNECTION IN INTEGRATED CIRCUIT

RELATED APPLICATION

This application relies for priority upon Korean Patent Application No. 2001-44450, filed on Jul. 24, 2001, the contents of which are herein incorporated by reference in their entirety.

Field of the Invention

The present invention relates to an apparatus of testing an integrated circuit interconnection. More particularly, the present invention relates to a test apparatus which is suitable for testing a leakage protection reliability of an integrated circuit interconnection having a high via density.

BACKGROUND OF THE INVENTION

As semiconductor devices become highly integrated, sizes of individual devices and wires or interconnections become smaller. As one method of highly integrating the semiconductor devices, semiconductor devices may be formed to have three-dimensional structures. For example, interconnections of connecting semiconductor devices are formed over multiple layers to have three-dimensional structure in the semiconductor devices.

With reference to the multilayered interconnection, it is very difficult to form many semiconductor cells and to connect these cells one another for fabricating a circuit. Very crowded and complicated interconnections are formed in one layer. But, when the interconnections are complicated, it is almost impossible to connect all circuits in one layer. In order to resolve this difficulty and to increase the efficiency, first, a lower interconnection is formed, secondly, an interlayer dielectric layer is formed, and thirdly, an upper interconnection is formed. A contact hole is formed at the interlayer dielectric layer and a plug fills the contact hole to connect the upper interconnection with the lower interconnection, thereby forming a circuit. As the circuit becomes complicated, the number of the layers used in multilayered interconnection continuously increases.

When a circuit is designed according to a certain design rule, a test for reliability of an interconnection is performed. In the test, it is possible to test whether a gap between patterns is too narrow and a potential difference between patterns is too high. Also, for the test, a weak point where an electric field is concentrated is artificially fabricated, and a maximum voltage or a maximum current is applied thereto. In order to increase the efficiency of the test, a minimum interconnection part of the designed circuit is composed of a plurality of repeated patterns, a certain voltage is applied to each opposite patterns in repeated pattern pairs. The form of the pattern may not be identical with the real thing, but be simplified and fixed. As an important method of testing the leakage protection reliability, a standard comb—comb-like (hereinafter, simply comb—comb) pattern or comb-serpentine (hereinafter, simply comb-serpentine) pattern is used.

However, this method is used for evaluating a leakage protection reliability between interconnections in one layer. That is, in an initial step of fabricating an integrated circuit, a contact or a via connecting different layers has a lower density than the density of an interconnection formed in one layer. Additionally, when a via or a contact is required, it is possible to form it at a relatively untroubled point i.e. an area of relatively low circuit density. Thus, a conventional apparatus of testing an integrated circuit is for detecting a problem between narrow interconnections in one layer rather than a problem of a via or a contact connecting between layers.

FIG. 1 illustrates an apparatus of testing a comb-serpentine pattern, which is a typical example of a conventional apparatus of testing an integrated circuit.

Referring to FIG. 1, one comb pattern 10 or 20 has one length portion and multiple tooth portions extending orthogonally from the length portion at the same level with the length portion. The tooth portions are orthogonal to the length portion, parallel with one another and repeated, thereby having the same length. In a test apparatus, a pair of comb patterns 10 and 20 are aligned with facing each other, and the tooth portions of one comb pattern are running between other tooth portions of the other comb pattern. A serpentine pattern 30 is present between the pair of the comb pattern. Between the pair of the comb patterns, the serpentine-like pattern 30 passes parallel with the tooth portions between two tooth portions and turns vertically at a region between the length portion of one comb pattern and the end of the tooth portion of the other comb pattern. A maximum electric field 40 is localized at a region adjacent to the ends of the tooth portion and the neighboring serpentine pattern. Since the maximum electric field 40 is localized at the every end of the tooth portions, there are plural instances of maximum electric field 40. When a leakage or a short is not generated at the every maximum electric field 40, the design of a semiconductor device exhibits stability and reliability.

A form of apparatus for testing a leakage or a short generated between interconnection layers is shown in FIG. 2. In the form, two conductive layers 50 and 60 are formed and one interlayer dielectric layer 70 is interposed therebetween. Potential difference is applied through two electrodes 80 connected with each conductive layer. But, the form is too simplified to find a real-world problem related to a via or a contact according to a multilayered interconnection of a semiconductor device. Thus, in case that a via or a contact is substantially troubled in a relatively simple semiconductor device having few vias or contacts, the trouble is caught by an experiential method of trial and error.

As semiconductor devices become extremely highly integrated, and interconnections become multilayered, the density of vias or contacts increases. A short or a leakage current may be frequently generated between vias. However, in a highly integrated semiconductor device, a small difference in process conditions may result in a considerable difference in results or effects. For example, in case of using a different method of forming a via hole and filling the via hole with a conductive material, or in case of using a different conductive material, a formed via may have a different characteristic with respect to the leakage current or the short.

For more specific examples, in an integrated semiconductor device, copper is used for an interconnection and a via to reduce resistance of an interconnection or a contact. But, when the copper is processed, the processed surface of copper or copper oxide tends to be rough. Thus, using the copper may substantially result in the narrow interconnection gap due to the rough surface or other irregularity thereof and result in strong possibility of failure, in comparison with other interconnection metal having the same interconnection gap.

Additionally, when the copper is used, a dual damascene process is generally employed because of difficulty in patterning. When an aspect ratio of the via hole is increased, a barrier layer is formed at the surface of the via hole by employing a sputtering method before filling the via hole with metal interconnection. But, the barrier layer is not well stacked at an edge where the sidewall and the low surface of the via hole are connected, and thus, the copper of high conductivity may contact at a neighboring silicon oxide layer. A leakage or an insulation breakdown may be more frequently created at the bottom of the via than at other regions.

The leakage or the short may result from various causes. If there are a lot of spots having strong possibilities of failure like the leakage current or the short circuit, it is difficult to find out the failed spots and to revise them. Thus, without a systematic test, it is difficult to know whether a leakage or a short may be generated between vias in a semiconductor device. Consequently, a systematic and operational method is required also to detect the failed spots between vias or contacts. In order to realize the method, a test apparatus having a specific pattern is required, in which a design rule of a related semiconductor device is reflected and failed spots between vias are importantly treated to the exclusion of other failed possibilities between other parts.

SUMMARY OF THE INVENTION

Thus, it is an object of the present invention to provide an apparatus of testing a leakage protection reliability in multilayered interconnections of an integrated circuit, in which a failed spot such as a leakage or a short may be easily and effectively detected between vias.

It is another object of the present invention to provide an apparatus of testing a leakage protection reliability in interconnections of an integrated circuit, in which a failed spot such as a leakage or a short is systematically and intentionally detected between vias.

It is still another object of the present invention to provide an apparatus of testing a leakage protection reliability in interconnection of an integrated circuit having a pattern, in which a failed spot related to a via of a semiconductor device is tested by confirming a problem between vias, at the exclusion of influence between a via and an interconnection.

The present invention is directed to an apparatus of testing a leakage protection reliability in interconnections of an integrated circuit. The apparatus includes a serpentine pattern and a comb pattern. These patterns are not formed in one conductive layer.

In a first structure of the present invention, the comb pattern has a straight length portion, and multiple tooth portions which orthogonally protrude from the length portion. The tooth portions are parallel with one another and repeated at the same level with the length portion, thereby having the same length. Vias of the comb pattern are formed vertically from the ends of the tooth portions. The serpentine pattern includes a unit part and a connection part.

The connection part connects two unit parts. The unit part has two tooth parallel parts, a length parallel part, and two vias. The tooth parallel part is parallel with the tooth portion and the end of the tooth parallel part is spaced from the end of the tooth portion by a minimum design length. The length parallel part is parallel with the length portion and connects the two tooth parallel parts.

The two vias of the serpentine pattern extend vertically from the ends of the two tooth parallel parts. The vias of the serpentine and the comb patterns are parallel with one another through the same interlayer dielectric layer. The via of the comb pattern is preferably located within the minimum design length deviation from an imaginary line connecting the neighboring vias of the serpentine pattern at the central position between the neighboring two vias of the serpentine pattern according to a design rule.

The connection part is parallel to the length portion and connected with the ends of the vias of the neighboring two unit parts, thereby electrically connecting the two unit parts. Additionally, the first structure of the present invention includes means of applying a certain bias voltage to the comb and the serpentine patterns, respectively, thereby generating a potential difference between the two patterns.

In the present invention, the tooth parallel part is preferably longer than the length parallel part at least by the minimum design length according to the design rule. Thus, it is easy and effective to find out a failed spot such as a leakage or a short resulting from the interaction between the via of the comb pattern and the neighboring two vias of the serpentine pattern, at the exclusion of the vias which are located at an opposite position. Also, the connection part should be spaced wide apart from the neighboring length portion by at least the minimum design length according to the design rule.

In the apparatus of the present invention, the comb pattern and the serpentine pattern are formed of a conductive layer including a conductive semiconductor layer, and insulated from each other. The comb pattern and the serpentine pattern may or may not be formed of one material.

The vias of the serpentine pattern electrically connect the connection part and the tooth parallel part which are present at different levels, but the other vias of the comb pattern may or may not connect the tooth portion with other conductor. Also, the via of the comb pattern may be formed differently from the other via of the serpentine pattern in the width thereof.

In a first aspect of the present invention, the length portion and the tooth portion may be formed at a lower interconnection layer and the vias of the comb pattern may be formed to an upward direction from the end of the tooth portion. The connection part may be formed at the same level with the length portion and the tooth portion, and the unit part may be formed at a relatively upper interconnection layer, or on the contrary, the connection part may be formed at the upper interconnection layer and the unit part may be formed at the lower interconnection layer.

If the length portion and the tooth portion in the comb pattern are formed at a relatively upper interconnection layer, the via of the comb pattern extends to a downward direction from the end of the tooth portion. The connection part may be formed at the same upper interconnection layer with the length portion and the tooth portion, and the unit part may be formed at a relatively lower interconnection layer. In contrast, the connection part may be formed at the lower interconnection layer and the unit part may be formed at the upper interconnection layer.

In any form described above, one via of the comb pattern is spaced from the neighboring two vias of the serpentine pattern by the minimum design length, and the three vias of the comb pattern and the serpentine pattern are formed in a line through the same interlayer dielectric layer.

According to a second aspect of the present invention, another comb pattern is added laterally from the serpentine pattern and at the opposite position of the original comb pattern. The two comb patterns are aligned with facing each other, and the one serpentine pattern is interposed between i.e. interleaved with, the two comb patterns. The tooth portions of the additional comb pattern are running between the tooth parallel parts and extend parallel therewith. The tooth portions and the length portions of the two comb patterns are formed at the same level, and the vias formed at the ends of the tooth portions in the two comb patterns extend in the same direction. In the second aspect, the length parallel part of the serpentine pattern has a level different from the level of the tooth parallel part and electrically connects with the tooth parallel part. As the new comb pattern is added, the length parallel part acts as a connection part, and thus, it may be referred to as another connection part. The tooth parallel parts are parallel to the all tooth portions of the two comb patterns. Vias of the serpentine patterns are formed at all turning points where the tooth parallel parts are met with the connection parts or the length parallel parts.

The additional comb pattern has the same shape with the original comb pattern, so that the additional one may be overlapped with the original one through a parallel movement and rotation. Alternatively, the additional one may be different from the original one in length or width of the tooth portion, or in a material thereof.

In the second aspect of the present invention, the serpentine pattern may or may not have the identical opening or aperture size with respect to the comb patterns located to the left and right hand side of the serpentine pattern. That is, a design length between a via of the original comb pattern and the neighboring two vias of the serpentine pattern may be different from that between another via of the additional comb pattern and the neighboring two vias of the serpentine pattern.

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Embodiment 1

Figure 1:
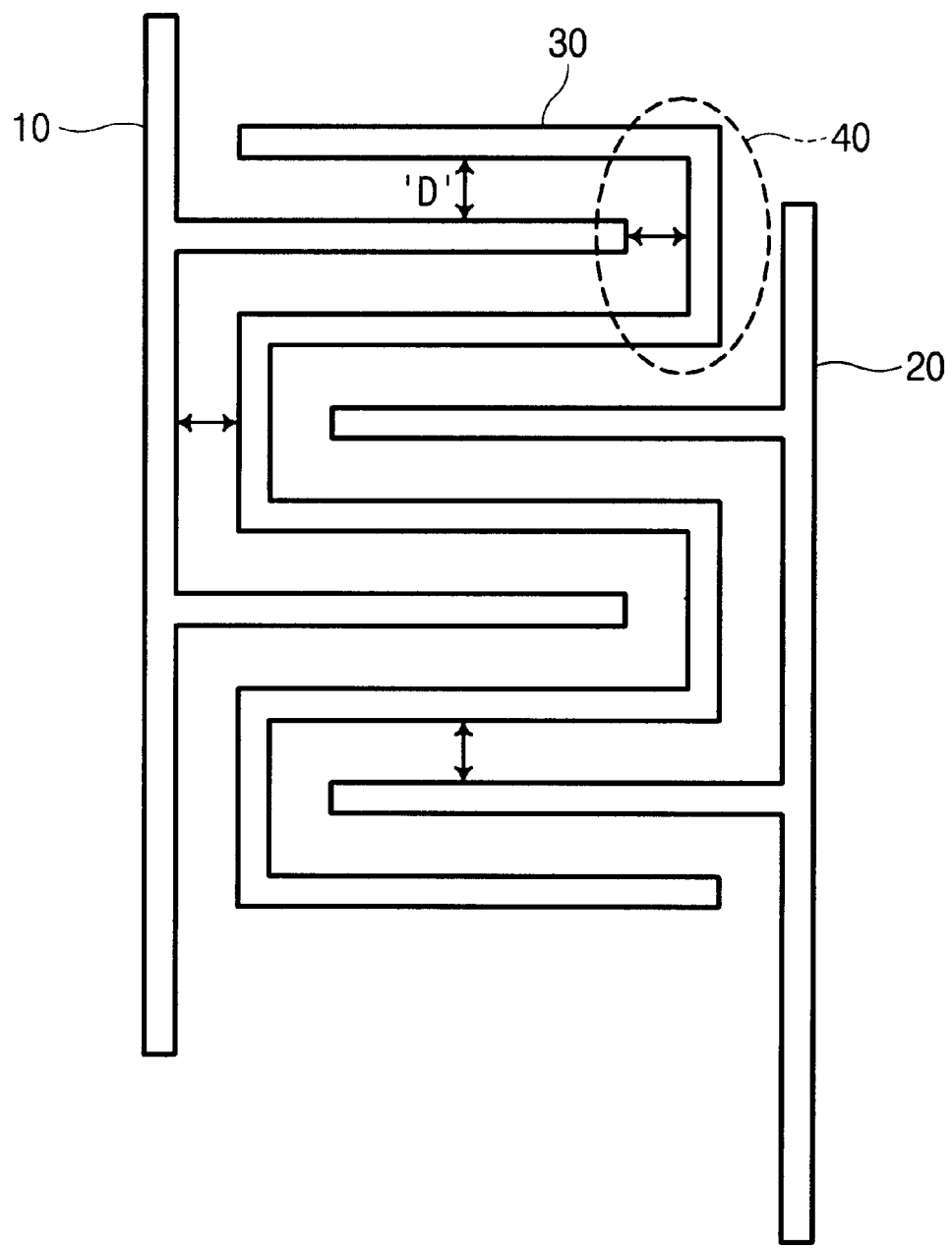
FIG. 1 illustrates a schematic plan view showing an apparatus of testing a comb-serpentine pattern as a typical example of a conventional test integrated circuit.
Figure 2:
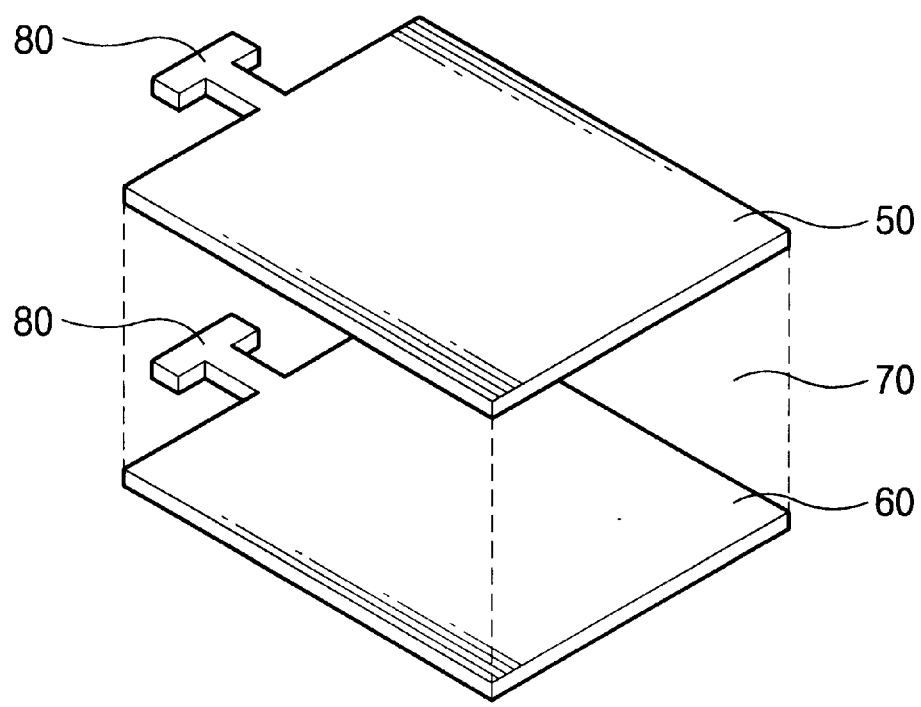
FIG. 2 illustrates a concept diagram showing conventional apparatus of testing a failed spot of a leakage current or a short between interconnection layers.
Figure 3:
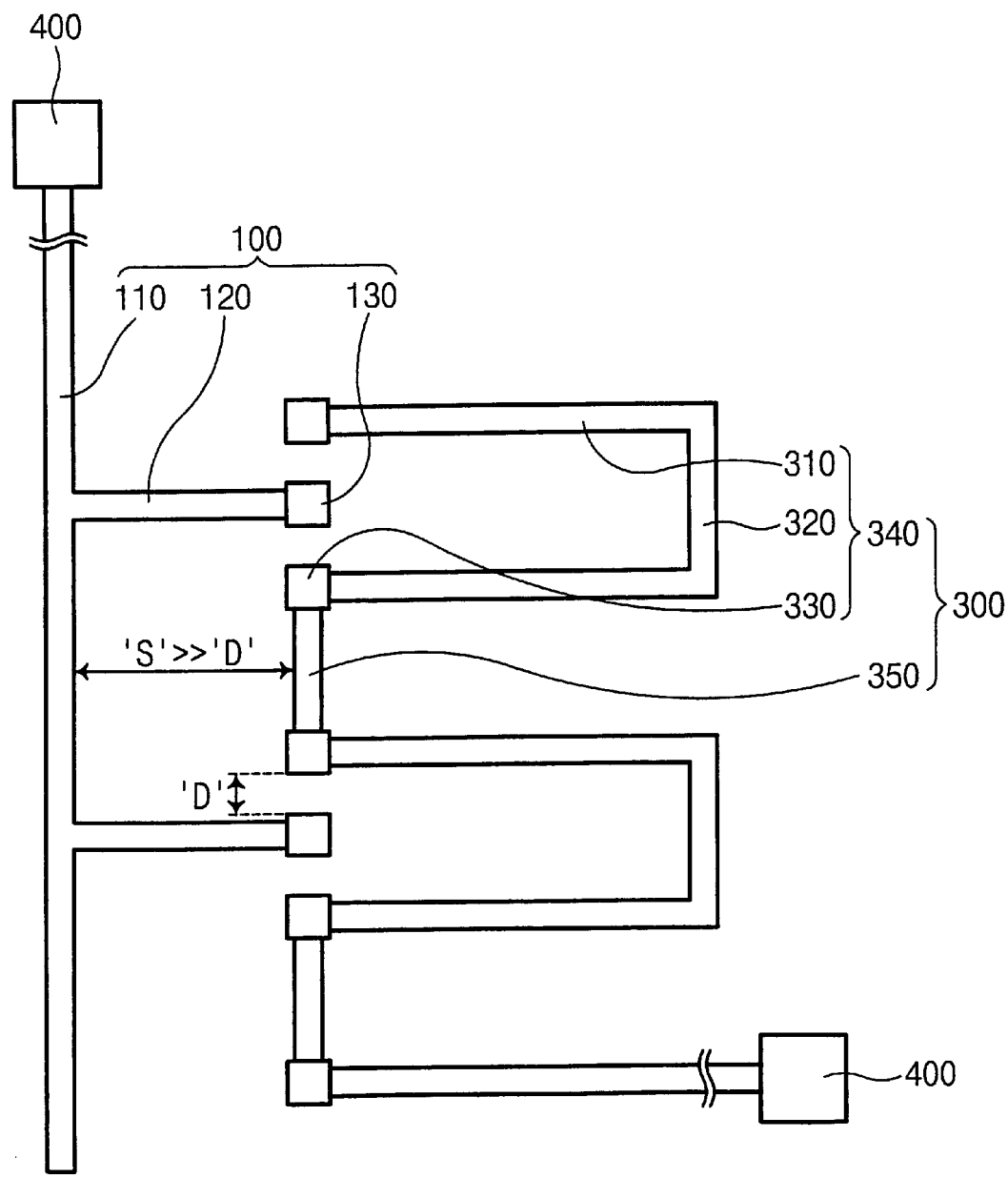
FIG. 3 illustrates a partial top plan view of a part in a preferred embodiment where a comb pattern and a serpentine pattern are provided according to a first structure of the present invention.

FIG. 3 is a partial plan view of a part in an embodiment where a comb pattern and a serpentine pattern are provided according to a first structure of the present invention.

Figure 4:
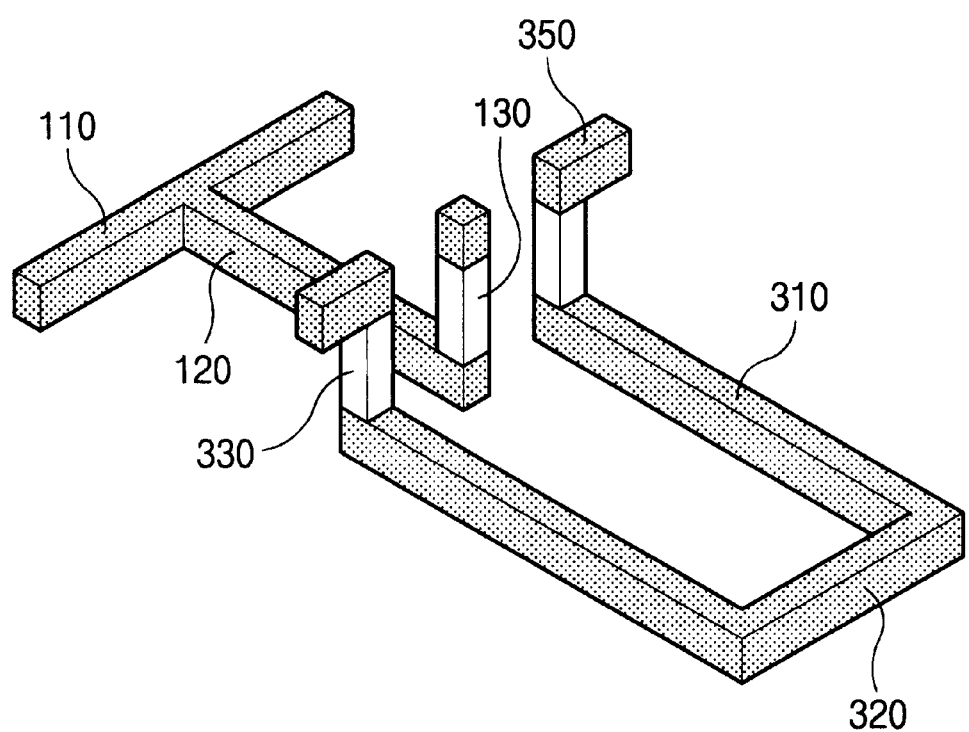
FIGS. 4, 6, 8, and 10 illustrate partial isometric views selectively showing parts which will be repeatedly formed, in specific embodiments of the same preferred embodiment of FIG. 3.

FIG. 4 is a partial isometric view showing parts which will be repeatedly formed, i.e., one tooth portion 120, a part of a neighboring length portion 110, and parts 340 and 350 of a serpentine pattern 300, in a specific embodiment out of the same embodiments of FIG. 3. In FIG. 4, a length portion 110 and a tooth portion 120 composing a comb pattern 100 are formed at a lower interconnection layer. A unit part 340 of a serpentine pattern 300 is formed at the lower interconnection layer which has the same level with the length portion 110 and the tooth portion 120 in the comb-like pattern 100. A connection part 350 of the serpentine pattern 300 is formed at the upper interconnection layer.

Referring to FIGS. 3 and 4, in the present embodiment, a via 130 of the comb pattern 100 is spaced apart from adjacent to vias 330 of the serpentine pattern by a minimum design length D according to a design rule of a semiconductor device which is tested. A tooth parallel part 310 is longer than a length parallel part 320 at least by the minimum design length 'D' according to the design rule. The gap distance 'S' between the length parallel part 320 and the connection part 350 is at least the minimum design length D and generally several times thereof. The via 130 in the comb pattern extends at the end of the tooth portion 120 to an upward direction. Other vias 330 in the serpentine pattern 300 extend to an upward direction at the both ends of the unit part 340 composing the serpentine pattern 300, that is, at the both ends of the two tooth parallel parts 310 adjacent to the length portion 110. Two connection parts 350 are connected with the upper ends of the vias 330 in the serpentine pattern 300. The two connection parts 350 extend outwardly from the ends of the unit part 340 to be parallel to the length portion 110. Width of the via 330 is preferably as wide as that of an interconnection, but in a test apparatus having highly integrated patterns, the width of the via 330 may be wider than that of the interconnection.

In the present embodiment, the illustrated parts in FIG. 4 are repeatedly connected to form the comb pattern 100 and the serpentine pattern 300. Shown in FIG. 3, pads 400 are formed at one end of the length portion 110 of the comb pattern 100, and at another end of the serpentine pattern 300, for applying a certain voltage. When powers are supplied at these pads, a defined voltage bias may be applied between the comb pattern 100 and the serpentine pattern 300.

A method is provided to form the comb pattern 100 and the serpentine pattern 300 of FIG. 4 according to the present embodiment. In the method, a lower conductive layer is stacked of a semiconductor such as an impurity-doped polysilicon, of a metal such as copper, or of a dual layer of a semiconductor and a metal silicide, at a semiconductor substrate. This is patterned to form a length portion and a tooth portion in the comb pattern and a unit part in the serpentine pattern. The unit part includes two tooth parallel parts and a length parallel part.

When a lower interconnection pattern is formed, an interlayer dielectric layer is formed thereon. The interlayer dielectric layer may be formed of a CVD (chemical vapor deposition) silicon oxide layer which is generally used in a semiconductor device. A planarization process is preferably performed.

A patterning process is performed to form a groove through the interlayer dielectric layer to a certain depth for an upper interconnection pattern. A via hole is formed through a part of the groove to expose the ends of the tooth portion and the unit part at the lower interconnection pattern. A conductive barrier layer is thinly formed at the substrate where the via hole is formed. The barrier layer is formed of a titanium/titanium nitride by employing a sputtering method. Then, a copper seed layer is stacked by a CVD method and a bulk copper layer fills the groove and the via hole by employing an electroplate method.

The copper layer and the barrier layer, which are formed on the interlayer dielectric layer, are removed by a CMP (chemical mechanical polishing) process. Thus, the via and the upper interconnection are formed of the same material layer. Besides the above dual damascene process, other process may be employed. That is, a via hole may be formed through an interlayer dielectric layer with a via plug filling the via hole. A distinct conductive layer is stacked and patterned to form an upper interconnection pattern.

Figure 5:
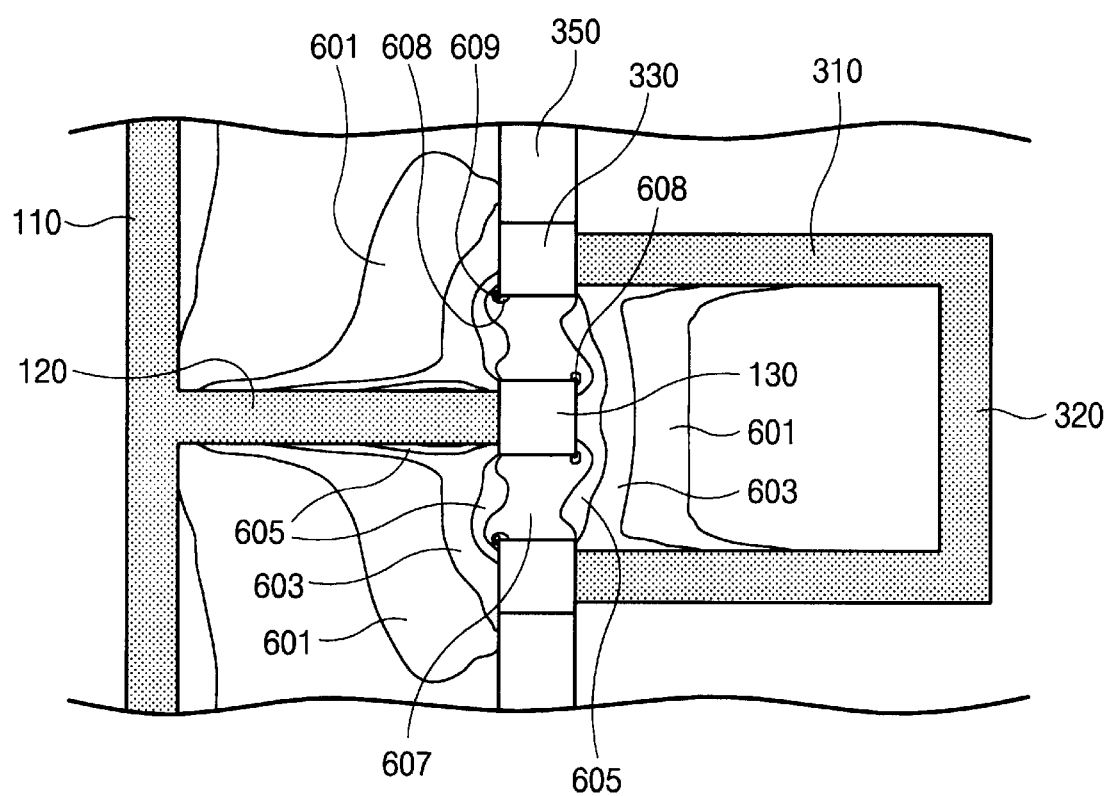
FIGS. 5, 7, 9, and 11 illustrate electric field profiles showing states when voltages are applied to a terminal of each pattern in the same specific embodiments of FIGS. 4, 6, 8, and 10.

FIG. 5 illustrates a plan view showing a field profile or a maximum field part by simulation at the same parts of FIG. 4 when a defined voltage is applied between a serpentine pattern and a comb pattern. Maximum field regions 609 appear at regions adjacent to tip parts of vias 330 and 130. Other electric field regions 608, 607, 605, 603, and 601 having gradually lower field levels sequentially appear to surround higher field regions, respectively. Thus, a test apparatus of the present embodiment forms the maximum field regions at several regions, so that it is possible to know whether failed spots are generated at regions adjacent to vias and to increase the reliability of a semiconductor device by testing a design thereof.

Embodiment 2

Figure 6:
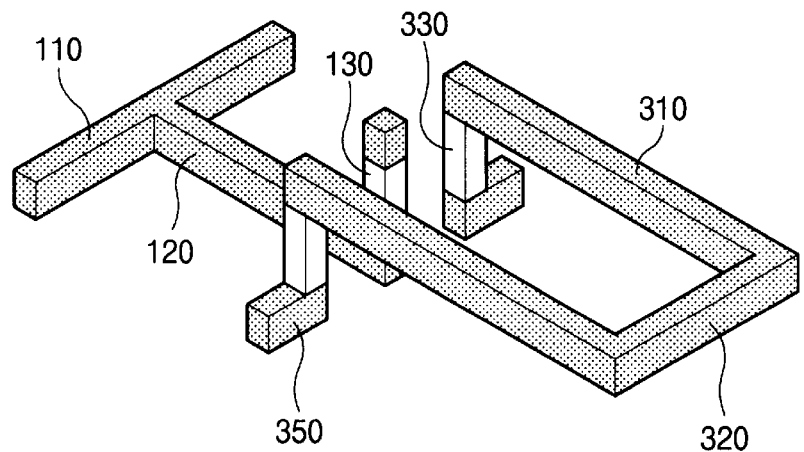

In FIG. 6, a length portion 110 and a tooth portion 120 in a comb pattern 100 are formed at a lower interconnection layer, and a connection part 350 in a serpentine-like pattern is formed at the lower interconnection layer which is the same level with the length portion 110 and the tooth portion 120. A tooth parallel part 310 and a length parallel part 320 composing a unit part 340 are formed at an upper interconnection layer.

FIG. 6 is like FIG. 3, except for the position and sequence on and in which the connection part 350 and the unit part 340 in the serpentine pattern are formed. A gap between a via 130 in the comb pattern 100 of the center and other vias 330 in the serpentine pattern 300; lengths of a length parallel part 320 and a tooth parallel part 310; length of a tooth portion 120; and pads for power supply, are the same with the embodiment 1. The vias 330 in the serpentine pattern 300 extend in a downward direction, at the both ends of the unit part 340, i.e., at both ends of the two tooth parallel parts 310 adjacent to the length portion 110. Two connection parts 350 are connected with the lower ends of the vias 330 in the serpentine pattern 300.

Figure 7:
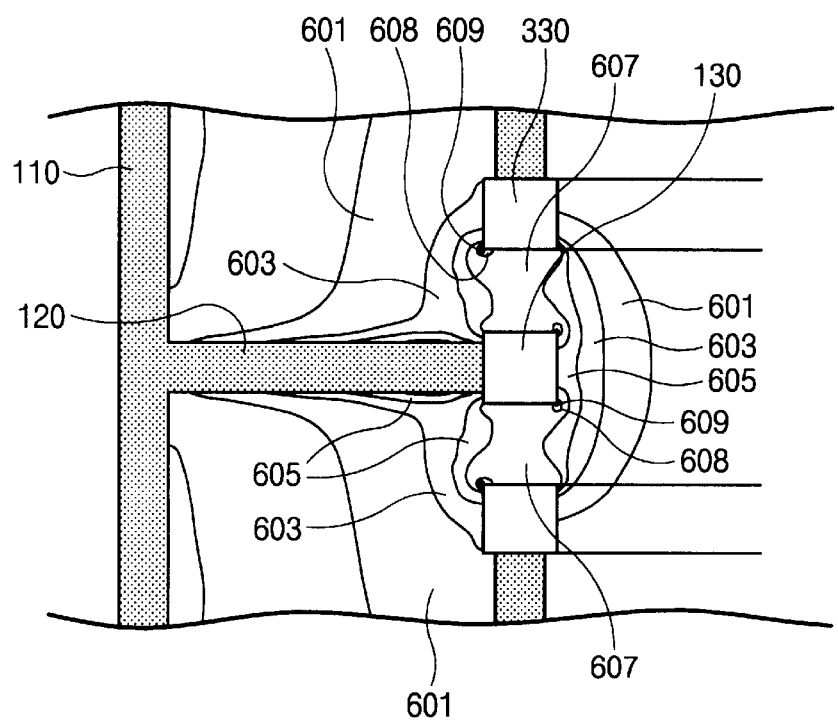

Referring to FIG. 7, a maximum field region 609 appears adjacent to tip parts of the vias 130 and 330. Other electric field regions 608, 607, 605, 603 and 601 having gradually lower field levels surround higher field regions, respectively, but the profile in FIG. 7 appears somewhat different from that in FIG. 5.

Embodiment 3

Figure 8:
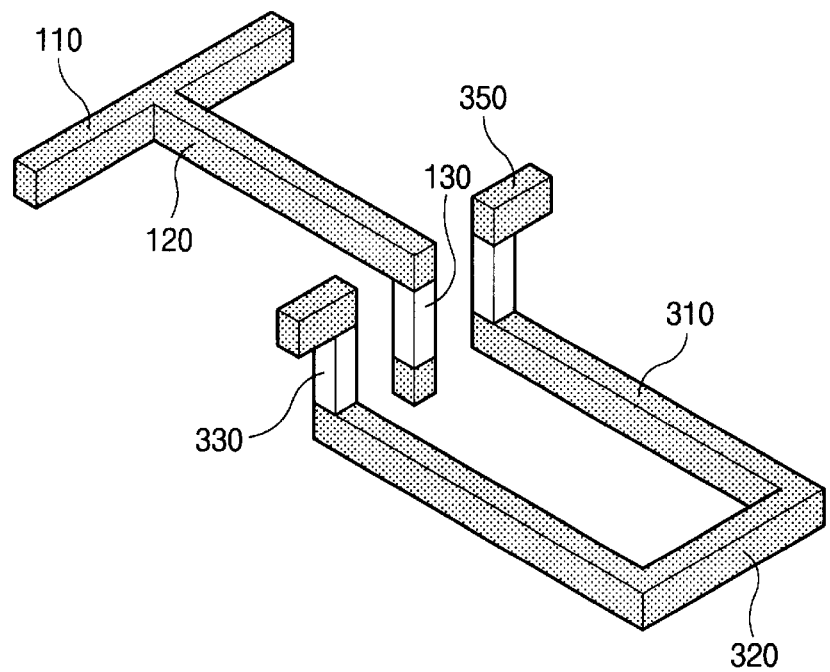

Referring to FIGS. 8 and 3, a length portion 110 and a tooth portion 120 in a comb pattern 100 are formed at an upper interconnection layer. A connection part 350 in a serpentine pattern 300 is formed at an upper interconnection layer. A tooth parallel part 310 and a length parallel part 320 are formed at a lower interconnection layer to from a unit part 340 in the serpentine pattern. In this embodiment, which is like embodiment 2 except for the position and sequence on and in which the connection part 350 and the unit part 340 in the serpentine-like pattern 300 are formed, all details are the same with the embodiment 1.

Figure 9:
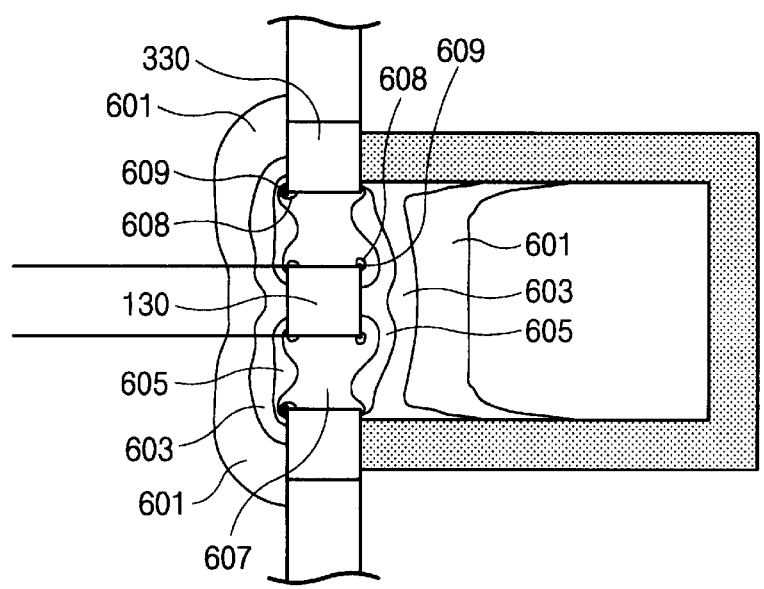

Referring to FIG. 9, as in embodiment 1, a maximum field region 609 appears at regions adjacent to tip parts of vias 130 and 330, and gradually lower field regions 608, 607, 605, 603, and 601 are formed to surround higher field regions. But, the entire field profile in FIG. 9 appears different from those in FIGS. 5 and 7.

Embodiment 4

Figure 10:
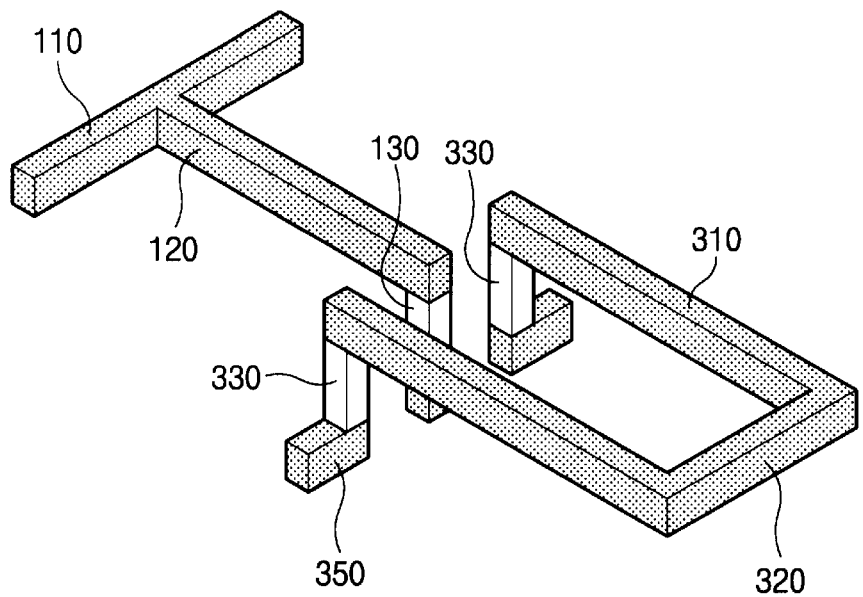

Referring to FIGS. 3 and 10, a length portion 110 and a tooth portion 120 are formed at an upper interconnection layer to form a comb pattern 100. Two connection parts 350 of the serpentine pattern 300 are formed at a lower interconnection. A length parallel part 320 and two tooth parallel parts 310 composing a unit part 340 in the serpentine pattern 300 are formed at the upper interconnection layer which is the same level with the length portion 110 and the tooth portion 120 in the comb pattern 100. These patterns are repeated at least twice and connected with each other to form a part of a test apparatus of the present invention.

Figure 11:
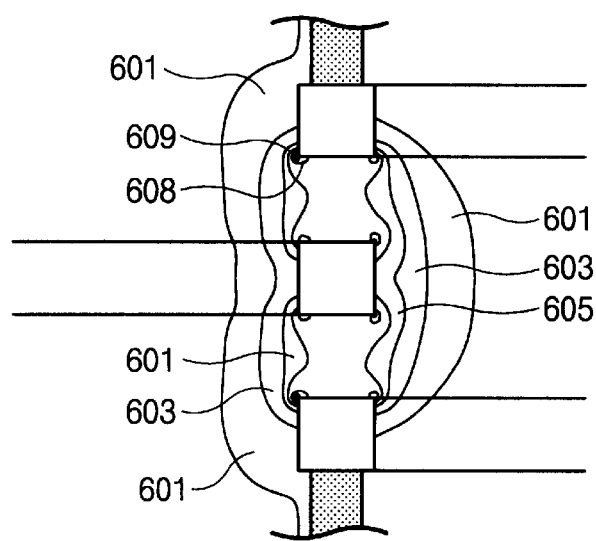

Referring to FIG. 11, a field profile or a maximum field region is shown by simulation in the present embodiment 4 when a certain voltage is applied between the serpentine pattern and the comb pattern.

Embodiment 5

Figure 12:
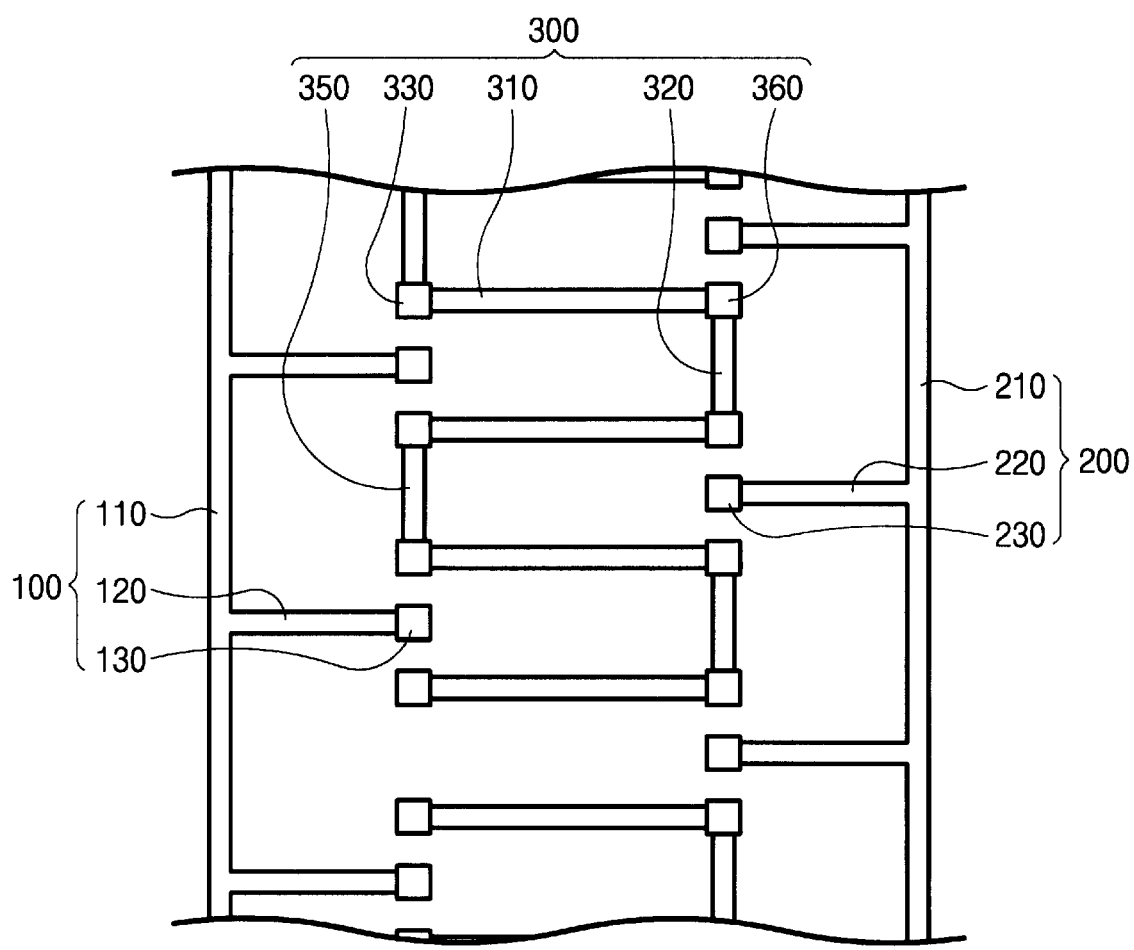
FIG. 12 illustrates a partial top plan view of a part in a preferred embodiment where a comb pattern and a serpentine pattern are provided according to a second structure of the present invention.

FIG. 12 illustrates a partial top plan view of a part in an embodiment when a comb pattern and a serpentine pattern are set up according to a second structure of the present invention.

Figure 13:
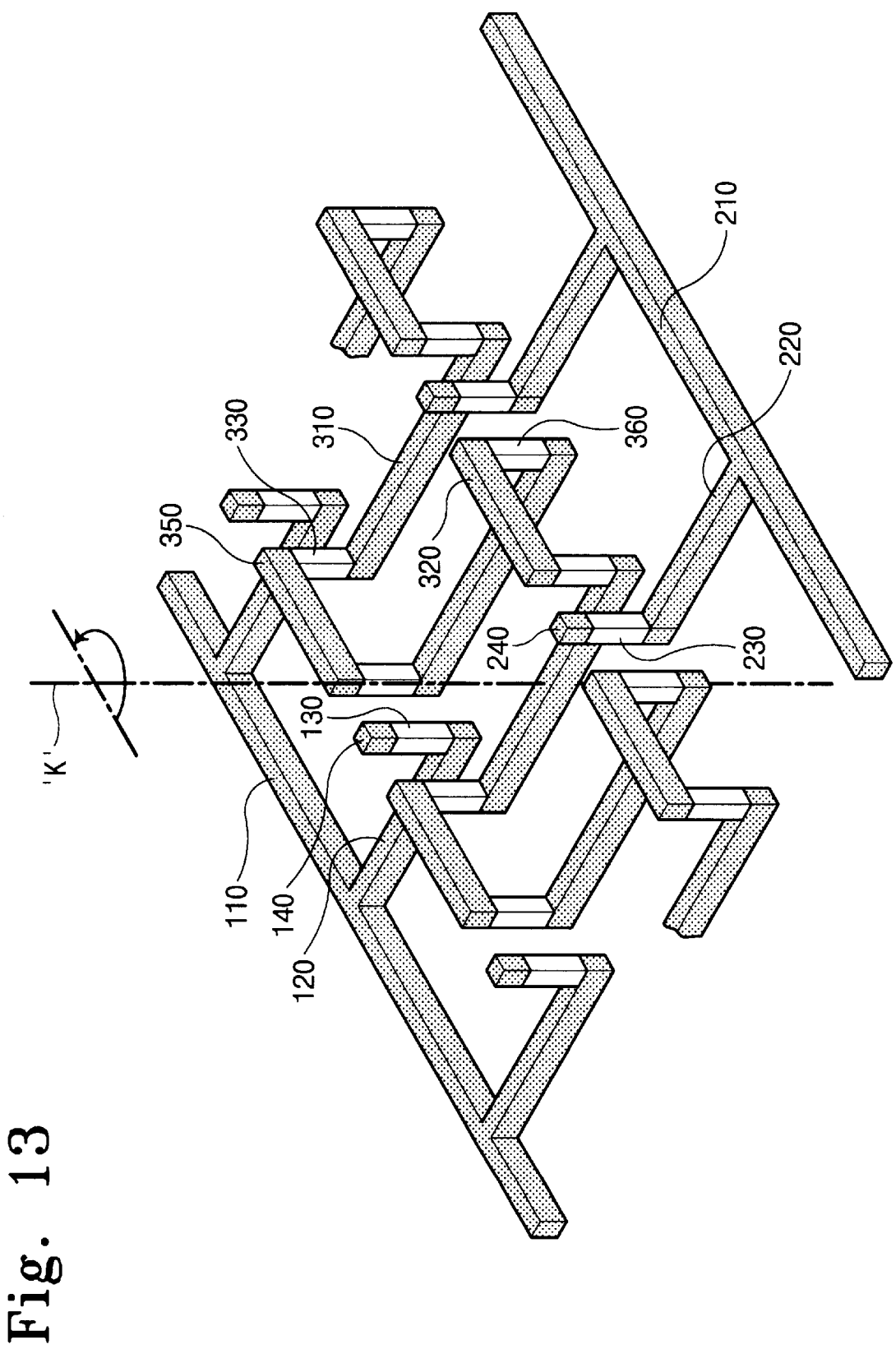
FIGS. 13 through 16 illustrate partial isometric views which selectively showing parts which will be repeatedly formed, in specific embodiments of the same preferred embodiment of FIG. 12.

Referring to FIGS. 12 and 13, length portions 110 and 210, and tooth portions 120 and 220, which compose comb patterns 100 and 200, are formed at a lower interconnection layer. A connection part 350 and a length parallel part 320 in a serpentine pattern 300 are formed at an upper interconnection layer which is a different level from the length portions 110 and 120 and the tooth portions 120 and 220. A tooth parallel part 310 is formed at the lower interconnection layer. These patterns are repeatedly connected to form a core part of a test apparatus.

Although the illustrated parts in FIG. 13 are rotated in 180 degree on a vertical axis 'K', the rotated patterns have the same shape with the original patterns. Thus, in the present embodiment, the length parallel part 320, which has been directly connected with the tooth parallel part 310 at the same level in the former embodiments 1 through 4, is connected with a tooth parallel part 310 at a different level through an additional via 360 and acts as a connection part 350.

Also, one serpentine pattern 300 is used for forming an electric field between two comb patterns. Except for these differences in the level of the length parallel part 320 and the shape of the entire structure, the present embodiment 5 has similarities with the embodiment 1, since parts are repeatedly connected and the electric field may be localized between a via 130 or 230 in a comb pattern and a neighboring via 330 or 360 in a serpentine pattern. An apparatus of applying a bias voltage should be able to apply a certain bias to the additional comb pattern 200. Thus, all details, related to the comb pattern 100 and the serpentine pattern 300, may be identical with the embodiment 1.

The tooth parallel part 310 is required to be much longer than the connection part 350, so that a via 130 and neighboring two vias 330 do not affect an opposite via 230 and neighboring two vias 360. The second structure of the present embodiment 5 has an advantage that a structure of forming one via 130 and two neighboring vias 330 may be more highly integrated.

However, differently from the present embodiment, tooth portions 120 and 220 in the two comb patterns 100 and 200, composing the second structure of the present invention, may be longer than the minimum design length according to the design rule and have different lengths or different widths each other. And the lengths of the tooth parallel part 310 and the connection part 350 may be different. In this case, when the patterns are rotated in 180 degree on the vertical axis 'K', the rotated patterns are not identical with the original patterns.

Embodiment 6

Figure 14:
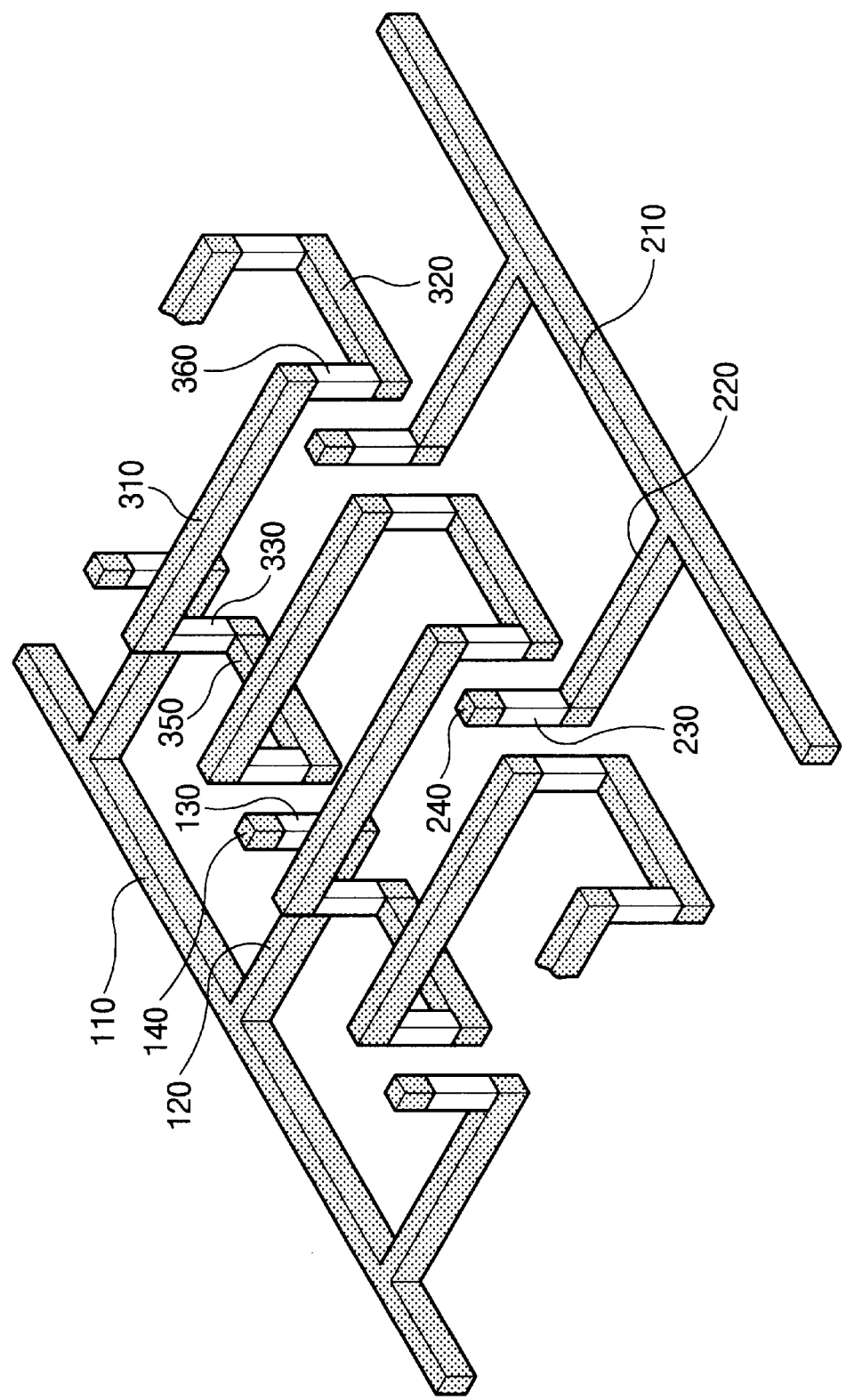

Referring to FIGS. 12 and 14, length portions 110 and 210, and tooth portions 120 and 220 in comb patterns 100 and 200 are formed at a lower interconnection layer, and a connection part 350 and a length parallel part 320 in a serpentine pattern 300 are formed at the same lower interconnection layer. A tooth parallel part 310 in the serpentine pattern is formed at an upper interconnection layer. The length parallel part 320 is connected at the lower interconnection layer with the tooth parallel part 310 through an additional via 360. Also, one serpentine pattern 300 forms an electric field between two comb patterns 100 and 200. Except for these differences in the level of the length parallel part 320 and the shape of the entire structure, the present embodiment 6 has similarities with the embodiment 2, since parts are repeatedly connected and an electric field may be localized between a via 130 or 230 in a comb pattern and a neighboring via 330 or 360 in a serpentine pattern.

In the present embodiment, vias 130 and 230 are present at the ends of the tooth portions 110 and 210 in the comb patterns 100 and 200, respectively, and other vias 330 or 360 are located at both sides of the via 130 or 230. The via 130 or 230 is spaced from the other via 330 or 360 by the minimum design length. The tooth parallel part 310 is longer than the connection part 350 and the length parallel part 320 at least by the minimum design length according to the design rule. The via 130 or 230 extends in an upward direction at the end of the tooth portion 120 or 220. The other vias 330 and 360 extend downwardly from the both ends of the tooth parallel part 310. The bottoms of the vias 330 and 360 are connected with the connection part 350 and the length parallel part 320, respectively.

Embodiment 7

Figure 15:
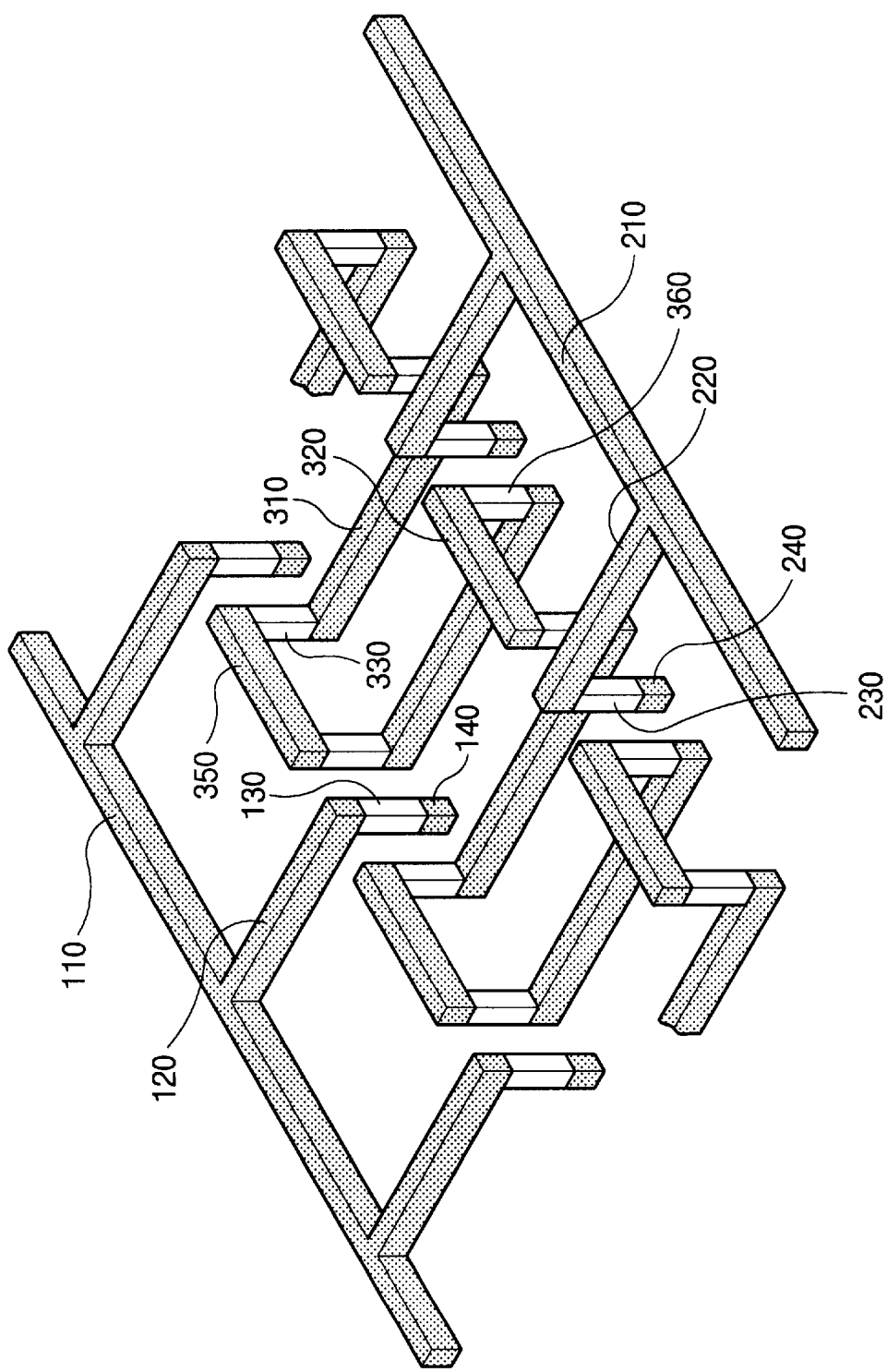

Referring to FIG. 15, length portions 110 and 210, and tooth portions 120 and 220 in comb patterns 100 and 200 are formed at an upper interconnection layer, and a connection part 350 and a length parallel part 320 in a serpentine pattern 300 are formed at the same upper interconnection layer. A tooth parallel part 310 is formed at a lower interconnection layer. The present embodiment 7 has substantial similarities with embodiment 3.

Embodiment 8

Figure 16:
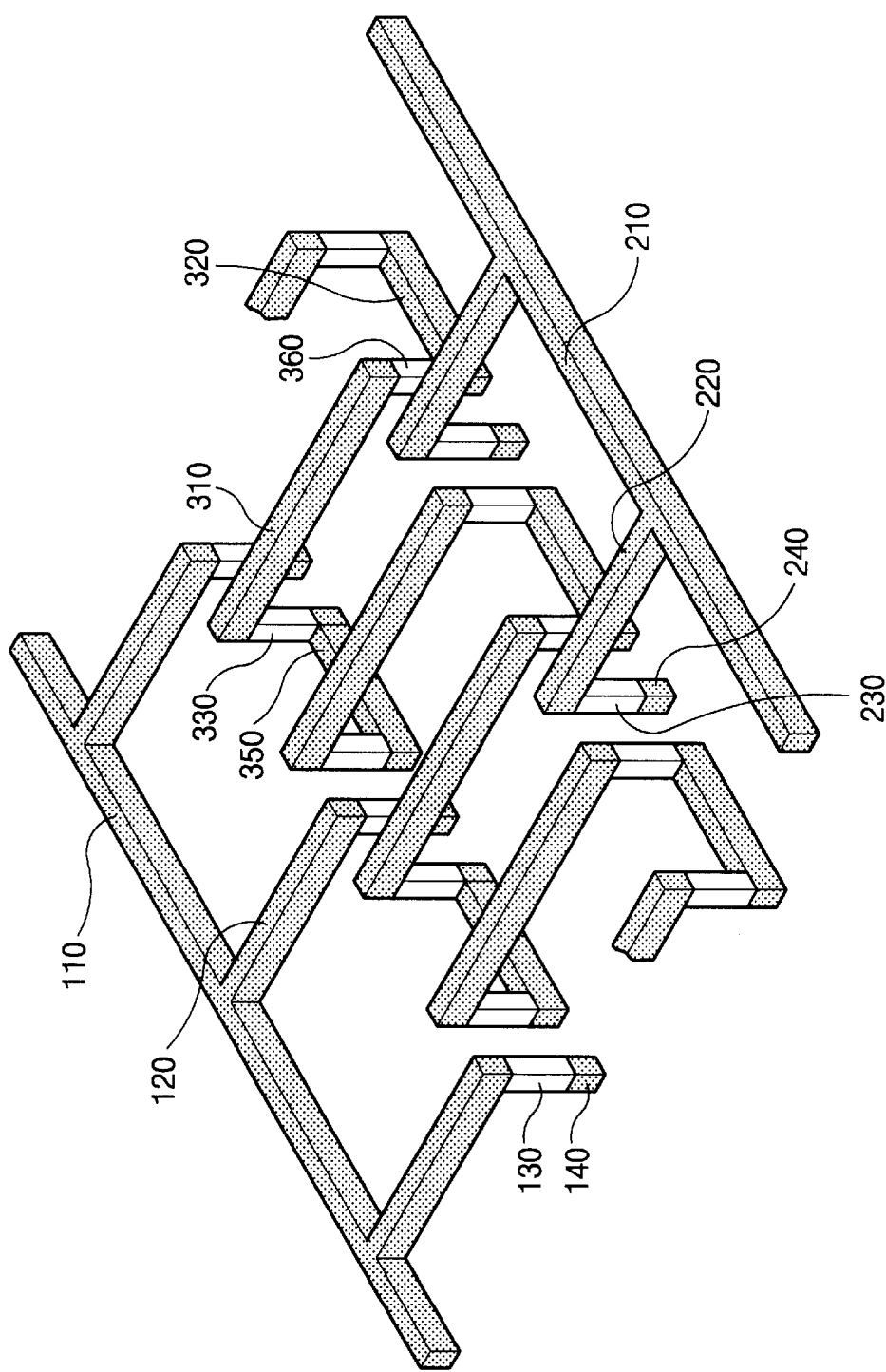

Referring to FIG. 16, length portions 110 and 210, and tooth portions 120 and 220 in comb patterns 100 and 200 are formed at an upper interconnection layer, and a connection part 350 and a length parallel part 320 in a serpentine pattern 300 are formed at a lower interconnection layer. A tooth parallel part 310 in the serpentine pattern 300 is formed at the upper interconnection layer. The present embodiment 8 has substantial similarities with embodiment 4.

According to the present invention, in multiple interconnections of a semiconductor device which is newly designed and used, it is possible to find out a failed spot such as a leakage current or a short easily and effectively by using a systematic and operational test apparatus. Thus, it is possible to reduce the amount of trial and error.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An apparatus of testing a leakage protection reliability of an integrated circuit interconnection, comprising:

at least one comb-like pattern comprising one straight length portion, multiple tooth portions and vias;

a serpentine-like pattern comprising multiple unit parts and at least one connection part; and means for applying a defined bias voltage between the comb-like pattern and the serpentine-like pattern to generate a potential difference between the two patterns, wherein the multiple tooth portions are substantially parallel with one another, are substantially orthogonal to the length portion at the same level with the length portion, and have substantially the same lengths, the vias of the comb-like pattern are vertically formed from the ends of the tooth portions through an interlayer dielectric layer, wherein the unit part comprises:

two tooth parallel parts whose ends are laterally spaced from the ends of the tooth portions, being substantially parallel with the tooth portions;

a length parallel part which is parallel to the length portion, connected with the ends of the two tooth parallel parts and shorter than the tooth parallel part at least by a minimum design length according to a specific design rule; and vias of the serpentine-like pattern, being present at the ends of the two tooth parallel parts, vertical to the two tooth parallel parts, parallel with the via of the end of the tooth portion, and spaced from the via of the comb-like pattern by the minimum design length according to the specific design rule, through the interlayer dielectric layer, wherein the connection part is substantially parallel with the length portion, present at another interconnection layer spaced from the tooth parallel part by the interlayer dielectric layer, and connected with the two vias of the serpentine-like pattern to connect the two unit parts electrically.

2. The apparatus as claimed in claim 1, wherein the via of the comb-like pattern is located within the minimum design length from an imaginary line connecting neighboring vias of the serpentine-like pattern at the central position between the neighboring two vias of the serpentine-like pattern.

3. The apparatus as claimed in claim 1, wherein the tooth parallel part is formed together with the tooth portion and the length portion at a lower interconnection layer under the interlayer dielectric layer.

4. The apparatus as claimed in claim 1, wherein the tooth parallel part is formed together with the length portion and the tooth portion at the upper interconnection layer over the interlayer dielectric layer.

5. The apparatus as claimed in claim 1, wherein the tooth parallel part is formed at the upper interconnection layer over the interlayer dielectric layer, and the length portion and the tooth portion are formed at the lower interconnection layer under the interlayer dielectric layer.

6. The apparatus as claimed in claim 1, wherein the tooth parallel part is formed at the lower interconnection layer under the interlayer dielectric layer, and the length portion and the tooth portion are formed at the upper interconnection layer over the interlayer dielectric layer.

7. The apparatus as claimed in claim 1, wherein the upper interconnection layer over the interlayer dielectric layer and the lower interconnection layer under the interlayer dielectric layer are formed of different conductive materials.

8. The apparatus as claimed in claim 1, wherein the vias of the comb-like and the serpentine-like patterns comprise a conductive barrier layer formed by a sputtering method at the outside of the vias, and a bulk copper surrounded by the conductive barrier layer.

9. The apparatus as claimed in claim 1, further comprising an additional comb-like pattern which exists at the opposite position of the comb-like pattern and laterally from the serpentine-like pattern, and has the same components with the comb-like pattern, wherein the tooth portions of the additional comb-like pattern are running substantially parallel with and interleave the tooth parallel parts, and the ends of the vias of the additional comb-like pattern are spaced from an imaginary line connecting the neighboring vias of the serpentine-like pattern by the minimum design length according to a design rule, wherein the length parallel part of the unit part is present at a level different and spaced from the level of the two tooth parallel parts by the interlayer dielectric layer, and electrically connected with the two tooth parallel parts through the vias formed at the ends of the tooth parallel parts of the serpentine-like pattern, wherein the means of applying a bias voltage may apply a defined bias voltage also to the additional comb-like pattern.

10. The apparatus as claimed in claim 9, wherein the tooth parallel part is formed together with the length portions and the tooth portions of the comb-like pattern and the additional comb-like pattern at a lower interconnection layer under the interlayer dielectric layer.

11. The apparatus as claimed in claim 9, wherein the tooth parallel part is formed together with the length portions and the tooth portions of the comb-like pattern and the additional comb-like pattern at an upper interconnection layer over the interlayer dielectric layer.

12. The apparatus as claimed in claim 9, wherein the tooth parallel part is formed at an upper interconnection layer over the interlayer dielectric layer, and the length portions and the tooth portions of the comb-like pattern and the additional comb-like pattern are formed at a lower interconnection layer under the interlayer dielectric layer.

13. The apparatus as claimed in claim 9, wherein the tooth parallel part is formed at a lower interconnection layer under the interlayer dielectric layer, and the length portions and the tooth portions of the comb-like pattern and the additional comb-like pattern are formed at an upper interconnection layer over the interlayer dielectric layer.

14. The apparatus as claimed in claim 9, wherein, in the comb-like pattern and the additional comb-like pattern, at least one of the width and length of the tooth portions, and the applied bias, is different.

15. The apparatus as claimed in claim 9, wherein the minimum design length according to the specific design rule between the via of the comb-like pattern and the neighboring via of the serpentine-like pattern is different from another minimum design length according to a design rule between the via of the additional comb-like pattern and the neighboring via of the serpentine-like pattern.

* * * * *